United States Patent
Hirayama et al.

(10) Patent No.: US 11,705,313 B2
(45) Date of Patent: Jul. 18, 2023

(54) INSPECTION METHOD AND PLASMA PROCESSING APPARATUS

(71) Applicant: TOKYO ELECTRON LIMITED, Tokyo (JP)

(72) Inventors: Yusuke Hirayama, Miyagi (JP); Shu Kusano, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/193,205

(22) Filed: Mar. 5, 2021

(65) Prior Publication Data

US 2021/0280401 A1 Sep. 9, 2021

(30) Foreign Application Priority Data

Mar. 9, 2020 (JP) ................. 2020-039635

(51) Int. Cl.
*H01J 37/32* (2006.01)

(52) U.S. Cl.
CPC .. *H01J 37/32935* (2013.01); *H01J 37/32183* (2013.01); *H01J 37/32311* (2013.01); *H01J 2237/24564* (2013.01)

(58) Field of Classification Search
CPC ........... H01J 37/32183; H01J 37/32311; H01J 37/32532; H01J 37/32715; H01J 37/32935; H01J 2237/24564; H01L 22/34
See application file for complete search history.

(56) References Cited

U.S. PATENT DOCUMENTS

2006/0220574 A1* 10/2006 Ogawa .............. H01J 37/32183
315/111.21

FOREIGN PATENT DOCUMENTS

| JP | H09-92491 A | 4/1997 |
| JP | 5320260 82 | 10/2013 |
| JP | 2018-125114 A | 8/2018 |

* cited by examiner

*Primary Examiner* — Henry Luong
(74) *Attorney, Agent, or Firm* — Weihrouch IP

(57) ABSTRACT

An inspection method is provided. The inspection method includes monitoring power of a reflected wave of a power wave supplied from a source power supply for generation of plasma in a plasma processing apparatus, and obtaining a fluctuation amount of a measured value within a period after initiation of the supply of the power wave. The fluctuation amount of the measured value is a fluctuation amount indicating a fluctuation in a peak-to-peak voltage at a lower electrode of the substrate support in the chamber or a fluctuation amount indicating a fluctuation in impedance of a load including the lower electrode.

9 Claims, 7 Drawing Sheets

INSPECTION METHOD AND PLASMA PROCESSING APPARATUS

CROSS-REFERENCE TO RELATED APPLICATIONS

This application claims priority to Japanese Patent Application No. 2020-039635, filed on Mar. 9, 2020, the entire contents of which are incorporated herein by reference.

TECHNICAL FIELD

Exemplary embodiments of the present disclosure relate to an inspection method and a plasma processing apparatus.

BACKGROUND

Plasma processing on a substrate is performed using a plasma processing apparatus. In the plasma processing apparatus, the substrate is accommodated in a chamber and processed using plasma generated within the chamber. When plasma ignition is unstable in the plasma processing apparatus, the substrate is damaged and contaminated.

Japanese Patent Application Publication No. 2018-125114 discloses a technique for detecting the ignition stability of plasma by observing reflected waves of microwaves used for generating plasma. In addition, Japanese Patent Application Publication No. H09-92491 discloses a technique for detecting the ignition stability of plasma by observing reflected waves of radio frequency waves used for generating plasma.

SUMMARY

The present disclosure provides a technique for obtaining an amount related to contamination of a substrate.

In accordance with an aspect of the present disclosure, there is provided an inspection method. The inspection method comprises monitoring power of a reflected wave of a power wave supplied from a source power supply for generation of plasma in a plasma processing apparatus. The power wave is a radio frequency wave or a microwave. The plasma processing apparatus comprises a chamber and a substrate support. The substrate support is configured to support a substrate in the chamber. The substrate support comprises a lower electrode. The inspection method further comprises obtaining a fluctuation amount of a measured value within a period after initiation of the supply of the power wave. The fluctuation amount of the measured value is a fluctuation amount indicating a fluctuation in a peak-to-peak voltage at the lower electrode or a fluctuation amount indicating a fluctuation in impedance of a load including the lower electrode.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
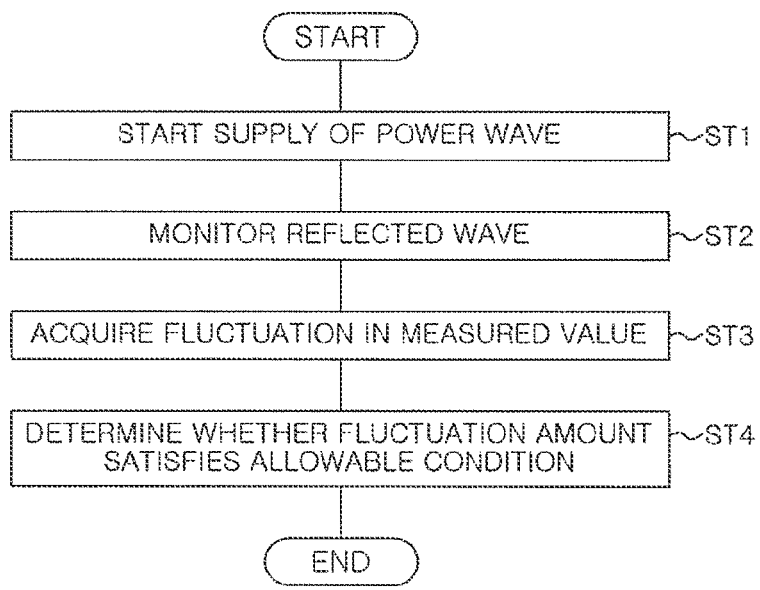
FIG. 1 is a flowchart of an inspection method according to one exemplary embodiment.

Hereinafter, various exemplary embodiments will be described.

In accordance with an aspect of the present disclosure, there is provided an inspection method. The inspection method comprises monitoring power of a reflected wave of a power wave supplied from a source power supply for generation of plasma in a plasma processing apparatus. The power wave is a radio frequency wave or a microwave. The plasma processing apparatus comprises a chamber and a substrate support. The substrate support is configured to support a substrate in the chamber. The substrate support comprises a lower electrode. The inspection method further comprises obtaining a fluctuation amount of a measured value within a period after initiation of the supply of the power wave. The fluctuation amount of the measured value is a fluctuation amount indicating a fluctuation in a peak-to-peak voltage at the lower electrode or a fluctuation amount indicating a fluctuation in impedance of a load including the lower electrode.

When a sheath (i.e., a plasma sheath) fluctuates on a substrate mounted on a substrate support, contaminants floating outside the sheath may be attached to the substrate. In the above exemplary embodiment, a fluctuation amount of a measured value indicates a fluctuation of the sheath formed on the substrate (for example, a fluctuation in thickness of the sheath). Therefore, according to the above exemplary embodiment, it is possible to obtain an amount related to contamination of the substrate.

In one exemplary embodiment, the above period may be a period after the power of the reflected wave has decreased to an allowable range.

In one exemplary embodiment, the inspection method may further comprise determining whether the fluctuation amount of the measured value satisfies an allowable condition.

In one exemplary embodiment, the allowable condition may be satisfied when a ratio of the fluctuation amount of the measured value to an average value of the measured value within the period is included within another allowable range.

In one exemplary embodiment, the fluctuation amount of the measured value may be a difference between a maximum value of the measured value and a minimum value of the measured value within the period.

In another exemplary embodiment, a plasma processing apparatus is provided. The plasma processing apparatus comprises a chamber; a substrate support, a source power supply, a matching unit, a measuring unit and a control unit. The substrate support comprises a lower electrode and is configured to support a substrate in the chamber. The source power supply is configured to supply a power wave for generation of plasma from gas in the chamber. The power wave is a radio frequency wave or a microwave. The matching unit is connected between the chamber and the source power supply. The measuring unit is configured to measure power of a reflected wave of the power wave. The control unit is configured to obtain a fluctuation amount of a measured value within a period after initiation of the supply of the power wave. The fluctuation amount of the measured value is a fluctuation amount indicating a fluctuation in peak-to-peak voltage at the lower electrode or a fluctuation amount indicating a fluctuation in impedance of a load including the lower electrode.

In one exemplary embodiment, the control unit is configured to obtain the fluctuation amount of the measured value within the period after the power of the reflected wave has decreased to an allowable range.

In one exemplary embodiment, the control unit is configured to determine whether the fluctuation amount of the measured value satisfies an allowable condition.

In one exemplary embodiment, the control unit is configured to determine that the allowable condition is satisfied when a ratio of the fluctuation amount of the measured value to an average value of the measured values within the period is included within another allowable range.

In one exemplary embodiment, the control unit is configured to obtain a difference between a maximum value of the measured value and a minimum value of the measured value within the period as the fluctuation amount of the measured value.

In one exemplary embodiment, the plasma processing apparatus further comprises a bias power supply, a matching unit, and a sensor. The bias power supply is electrically connected to the lower electrode. The matching unit is connected between the lower electrode and the bias power supply. The sensor is configured to measure the impedance, and the impedance is impedance of a load of the bias power supply.

In one exemplary embodiment, the plasma processing apparatus further comprises a sensor configured to measure a voltage at the lower electrode. The control unit is configured to acquire the peak-to-peak voltage from the voltage measured by the sensor.

In one exemplary embodiment, the plasma processing apparatus further comprises an upper electrode provided above the lower electrode. The source power supply is electrically connected to the upper electrode.

Hereinafter, various exemplary embodiments will be described in detail with reference to the accompanying drawings. The same reference numerals are assigned to the same or equivalent parts in the respective drawings.

FIG. 1 is a flowchart of an inspection method according to one exemplary embodiment. The inspection method shown in FIG. 1 (hereinafter referred to as "method MT") is performed to obtain an amount related to contamination of a substrate in a plasma processing apparatus. The contamination of the substrate may be caused by particles attached to the substrate and/or various defects that occur within the substrate due to the particles.

Figure 2:
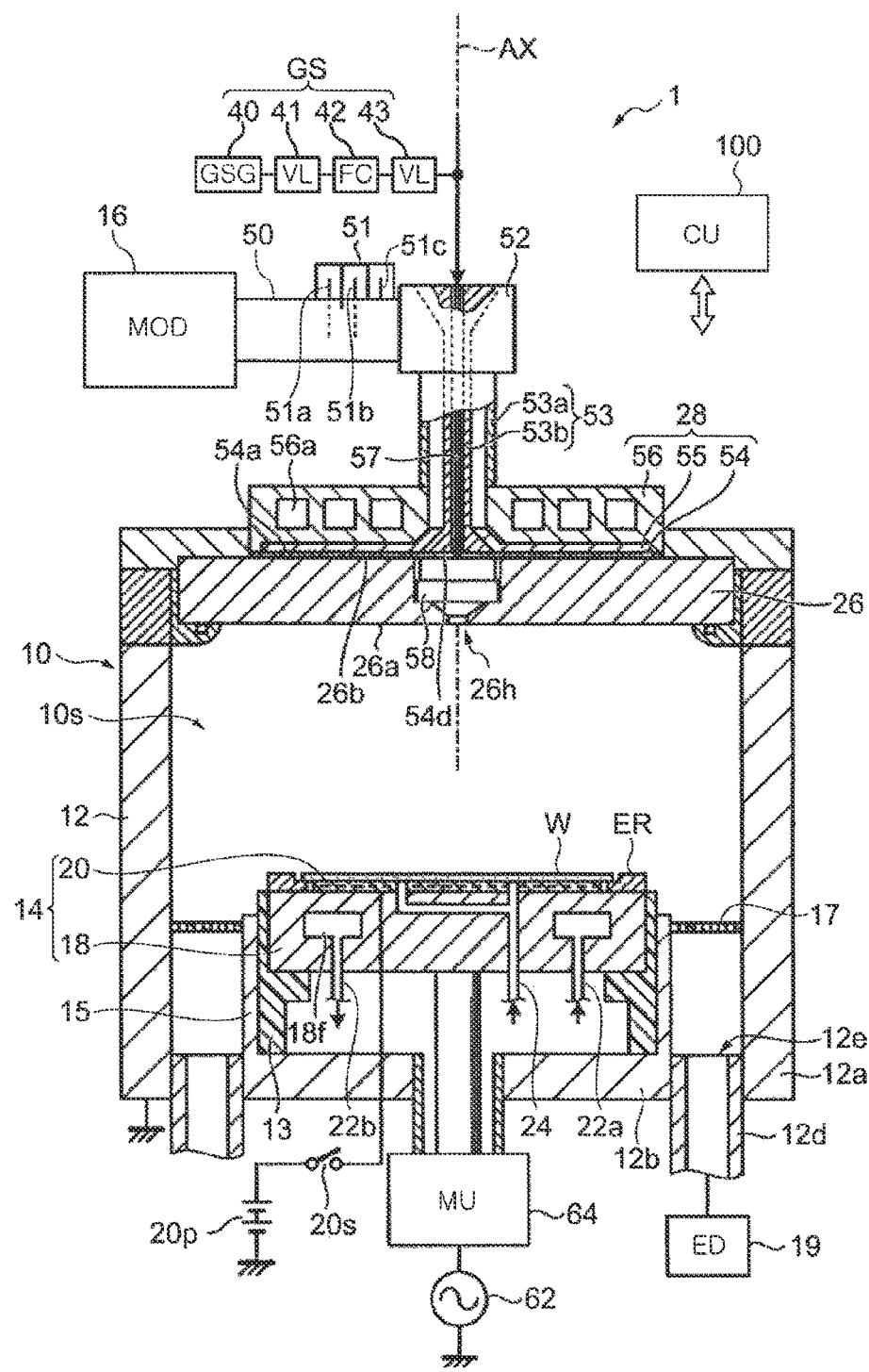
FIG. 2 is a schematic diagram illustrating a plasma processing apparatus according to one exemplary embodiment.

FIG. 2 is a schematic diagram illustrating a plasma processing apparatus according to one exemplary embodiment. The method MT may be applied to the plasma processing apparatus shown in FIG. 2. A plasma processing apparatus 1 shown in FIG. 2 includes a chamber 10. The chamber 10 defines an interior space 10s. A central axis of the chamber 10 and the interior space 10s is an axis AX extending in a vertical direction.

The chamber 10 includes a chamber main body 12. The interior space 10s is provided inside the chamber main body 12. The chamber main body 12 has a sidewall 12a and a bottom 12b. The sidewall 12a is formed in a substantially cylindrical shape. A central axis of the sidewall 12a is axis AX. The bottom 12b is provided at a lower end side of the sidewall 12a. An exhaust hole 12e is formed in the bottom 12b. An upper end of the sidewall 12a is opened.

The plasma processing apparatus 1 further includes a substrate support 14. The substrate support 14 is provided in the chamber 10. The substrate support 14 is configured to support a substrate W mounted thereon.

In one exemplary embodiment, the substrate support 14 includes a lower electrode 18 and an electrostatic chuck 20. The lower electrode 18 has a substantially disk shape and is formed of a conductive material such as aluminum. A central axis of the lower electrode 18 substantially coincides with the axis AX. The lower electrode 18 is supported by a support portion 13. The support portion 13 is formed of an insulating material. The support portion 13 has a cylindrical shape and extends upward from the bottom 12b. A conductive support portion 15 extends on an outer circumferential surface of the support portion 13. The support portion 15 has a cylindrical shape and extends upward from the bottom 12b along the outer circumferential surface of the support portion 13. An annular exhaust path is formed between the support portion 15 and the sidewall 12a.

A baffle plate 17 is provided in the exhaust path, that is, between the support portion 15 and the sidewall 12a. The baffle plate 17 has a ring shape. A plurality of through-holes are formed in the baffle plate 17. The exhaust hole 12e is provided below the baffle plate 17. An exhaust device (ED) 19 is connected to the exhaust hole 12e through an exhaust pipe 12d. The exhaust device 19 includes an automatic pressure control valve and a vacuum pump such as a turbo-molecular pump. The exhaust device 19 may reduce a pressure of a gas in the chamber 10 to a specified pressure.

The lower electrode 18 provides flow paths 18f therein. The flow paths 18f may spirally extend around the axis AX. The flow path 18f is connected to a supplier (for example, a chiller unit) through a pipe 22a. Furthermore, the flow path 18f is connected to the supplier through a pipe 22b. The supplier supplies a temperature-adjusted heat exchange medium (for example, a refrigerant) to the flow path 18f through the pipe 22a. The heat exchange medium supplied to the flow path 18f is returned to the supplier through the pipe 22b. A temperature of the substrate W is adjusted through heat exchange between the heat exchange medium and the substrate support 14.

The electrostatic chuck 20 is provided on the lower electrode 18. The substrate W is placed on the electrostatic chuck 20 when plasma processing is performed thereon. Furthermore, the substrate W is disposed in a region of the substrate support 14 surrounded by an edge ring ER.

The electrostatic chuck 20 is configured to hold the substrate W through electrostatic attraction. The electrostatic chuck 20 includes a main body formed of a dielectric and an electrode. The main body of the electrostatic chuck 20 has a substantially disk shape, and a central axis thereof substantially coincides with the axis AX. The electrode of the electrostatic chuck 20 is a conductive film and is provided in the main body of the electrostatic chuck 20. A direct current (DC) power supply 20p is connected to the electrode of the electrostatic chuck 20 through a switch 20s. When a DC voltage is applied from the DC power supply 20p to the electrode of the electrostatic chuck 20, electrostatic attraction is generated between the electrostatic chuck 20 and the substrate W. The substrate W is attracted to the electrostatic chuck 20 by the electrostatic attraction and is held by the electrostatic chuck 20.

The plasma processing apparatus 1 may further include a gas supply line 24. The gas supply line 24 supplies a heat transfer gas, for example, a helium (He) gas, between an upper surface of the electrostatic chuck 20 and a rear surface of the substrate W.

The plasma processing apparatus 1 further includes a dielectric window 26. The dielectric window 26 is formed of a dielectric material such as quartz. The dielectric window 26 is provided above an upper end of the sidewall 12a. The dielectric window 26 has a lower surface 26a that defines the interior space 10s. The dielectric window 26 closes an upper end opening of the sidewall 12a.

The plasma processing apparatus 1 further includes a microwave output device (MOD) 16 and an antenna 28. The microwave output device 16 outputs microwaves in order to excite the gas supplied into the chamber 10 to generate plasma. The microwave output device 16 is configured to variably adjust a frequency, power, and bandwidth of the microwave. The microwave output device 16 may generate a single frequency microwave, for example, by setting a bandwidth of the microwave to approximately zero. In addition, the microwave output device 16 may generate a microwave having a bandwidth with a plurality of frequency components therein. The plurality of frequency components may have the same power, or only a center frequency component in a band may have a power greater than a power of the remaining frequency components. In one example, the microwave output device 16 may adjust a power of a microwave in a range of 0 W to 5,000 W. The microwave output device 16 may adjust a frequency or center frequency of a microwave in a range of 2,400 MHz to 2,500 MHz. The microwave output device 16 may adjust a bandwidth of a microwave in a range of 0 MHz to 100 MHz. In addition, the microwave output device 16 may adjust a frequency pitch (carrier pitch) of a plurality of frequency components of a microwave in a band in a range of 0 kHz to 25 kHz.

A microwave output by the microwave output device 16 may be propagated through a waveguide 50, a matching unit 51, a mode converter 52, and a coaxial waveguide 53. The propagated microwave is introduced into the chamber 10 from the antenna 28.

One end of the waveguide 50 is connected to an output of the microwave output device 16. The other end of the waveguide 50 is connected to the mode converter 52. The waveguide 50 is, for example, a rectangular waveguide. The matching unit 51 is a tuner and is configured to match the load impedance of the microwave output device 16 (or source power supply described below) with the output impedance of the microwave output device 16. In one exemplary embodiment, the matching unit 51 includes stubs 51a, 51b, and 51c. Each of the stubs 51a, 51b, and 51c may be configured such that an amount of protrusion thereof with respect to an interior space of the waveguide 50 is adjustable. The matching unit 51 adjusts a protruding position of each of the stubs 51a, 51b, and 51c with respect to a reference position. The load impedance of the microwave output device 16 is adjusted by adjusting the protruding position of each of the stubs 51a, 51b, and 51c.

The mode converter 52 converts a mode of a microwave from the waveguide 50 and supplies the mode-converted microwave to the coaxial waveguide 53. The coaxial waveguide 53 comprises an outer conductor 53a and an inner conductor 53b. The outer conductor 53a has a substantially cylindrical shape, and a central axis thereof substantially coincides with the axis AX. The inner conductor 53b has a substantially cylindrical shape and extends inside the outer conductor 53a. A central axis of the inner conductor 53b substantially coincides with the axis AX. The coaxial waveguide 53 propagates the microwave from the mode converter 52 to the antenna 28.

The antenna 28 is provided on an upper surface 26b of the dielectric window 26. The antenna 28 includes a slot plate 54, a dielectric plate 55, and a cooling jacket 56.

The slot plate 54 is provided on the upper surface 26b of the dielectric window 26. The slot plate 54 is formed of a metal having conductivity and has a substantially disk shape. A central axis of the slot plate 54 substantially coincides with the axis AX. A plurality of slot holes 54a are formed in the slot plate 54, and as an example, the plurality of slot holes 54a form a plurality of slot pairs. Each of the plurality of slot pairs include two slot holes 54a that have substantially long hole shapes extending in directions intersecting each other. The plurality of slot pairs are arranged along one or more concentric circles around the axis AX. In addition, the slot plate 54 provides a through-hole 54d in a central portion thereof.

The dielectric plate 55 is provided on the slot plate 54. The dielectric plate 55 is formed of a dielectric material such as quartz and has a substantially disk shape. A central axis of the dielectric plate 55 substantially coincides with the axis AX. The cooling jacket 56 is provided on the dielectric plate 55. That is, the dielectric plate 55 is provided between the cooling jacket 56 and the slot plate 54.

The cooling jacket 56 provides a flow path 56a therein. The flow path 56a is configured such that a refrigerant is supplied therein. A surface of the cooling jacket 56 has conductivity. A lower end of the outer conductor 53a is electrically connected to an upper surface of the cooling jacket 56. In addition, a lower end of the inner conductor 53b extends through a hole formed in a central portion of each of the cooling jacket 56 and the dielectric plate 55 and is electrically connected to the slot plate 54.

A microwave from the coaxial waveguide 53 is propagated in the dielectric plate 55 and is supplied to the dielectric window 26 from the plurality of slot holes 54a of the slot plate 54. The microwave supplied to the dielectric window 26 is introduced into the chamber 10.

The plasma processing apparatus 1 further includes a gas supply unit GS. The gas supply unit GS is configured to supply a gas into the chamber 10. The gas supply unit GS is connected to a conduit 57 through a gas source group (GSG) 40, a valve group (VL) 41, a flow controller group (FC) 42, and a valve group (VL) 43. The gas source group 40 includes a plurality of gas sources. Each of the valve group 41 and the valve group 43 includes a plurality of on-off valves. The flow controller group 42 includes a plurality of flow controllers. Each of the plurality of flow control controllers is a mass flow controller or a pressure-type flow controller. Each of the plurality of gas sources of the gas source group 40 is connected to the conduit 57 through the corresponding valve of the valve group 41, the corresponding flow controller of the flow controller group 42, and the corresponding valve of the valve group 43.

The plasma processing apparatus 1 may further include an injector 58. The injector 58 supplies a gas from the conduit 57 to a through-hole 26h. The through-hole 26h is formed in the dielectric window 26. The gas supplied to the through-hole 26h of the dielectric window 26 is supplied into the chamber 10. The gas in the chamber 10 is excited by the microwave introduced from the dielectric window 26. As a result, plasma is generated in the chamber 10. The substrate W is processed with chemical species from the plasma generated in the chamber 10.

The plasma processing apparatus 1 further includes a control unit (CU) 100. The control unit 100 controls in overall respective units of the plasma processing apparatus 1. The control unit 100 may be a computer device. The control unit 100 may include a processor such as a central processing unit (CPU), a user interface, and a memory unit such as a memory.

The user interface includes a keyboard or touch panel through which a process manager inputs commands to manage the plasma processing apparatus 1, a display which visually displays an operating status or the like of the plasma processing apparatus 1, and the like.

The memory unit of the control unit 100 stores a control program and a process recipe. The processor of the control unit 100 executes the control program and controls each unit of the plasma processing apparatus 1 according to the process recipe.

Figure 3:
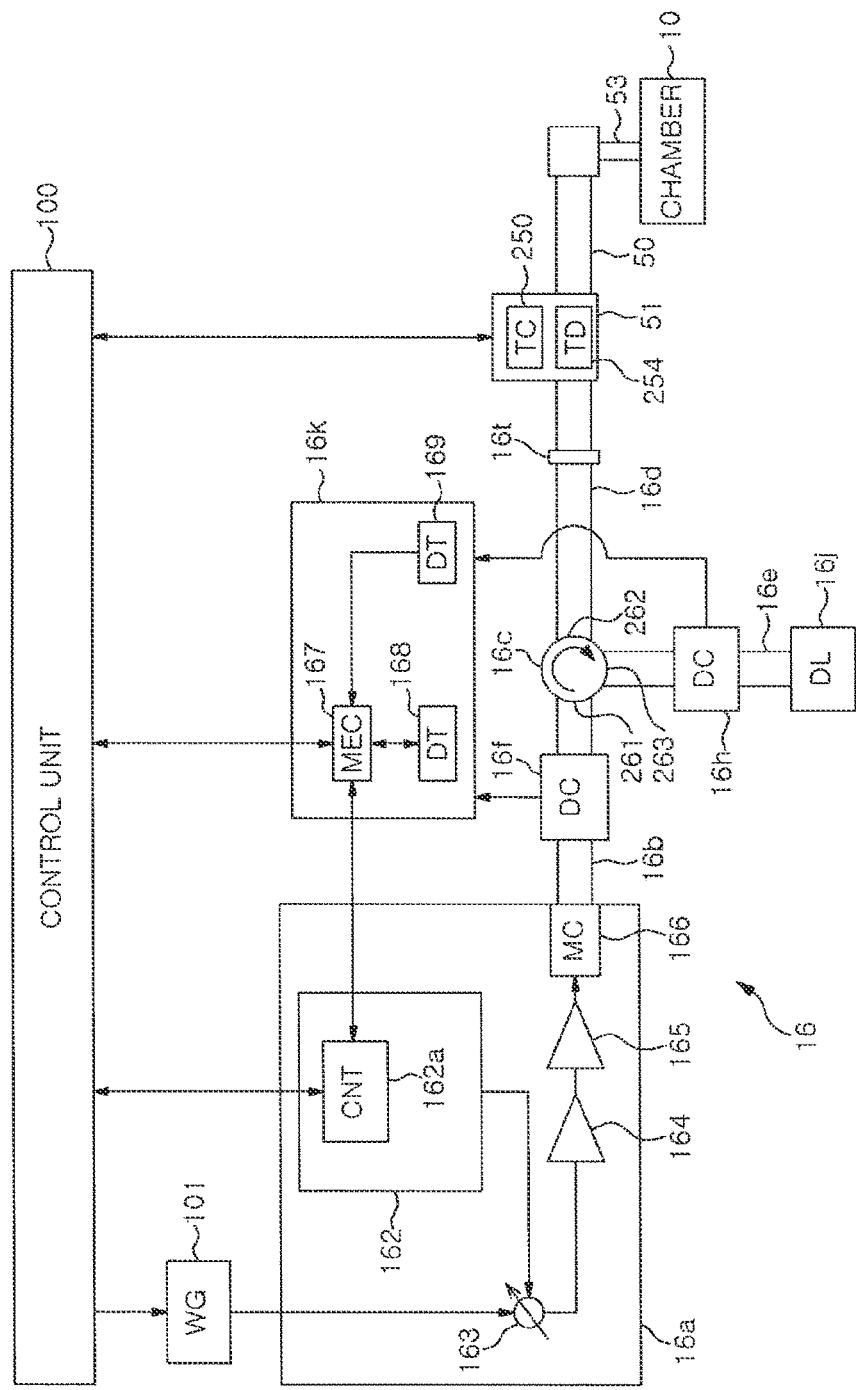
FIG. 3 is a diagram illustrating an example of a microwave output device.

Hereinafter, referring to FIG. 3, FIG. 3 is a diagram illustrating an example of the microwave output device. As shown in FIG. 3, the microwave output device 16 is connected to a waveform generator (WG) 101. The waveform generator 101 generates a microwave signal. The waveform generator 101 generates a microwave signal having a center frequency and a bandwidth respectively corresponding to a set frequency and a set bandwidth specified by the control unit 100. Alternatively, the waveform generator 101 generates a microwave signal having a single peak at the center frequency corresponding to the set frequency specified by the control unit 100.

Figure 4:
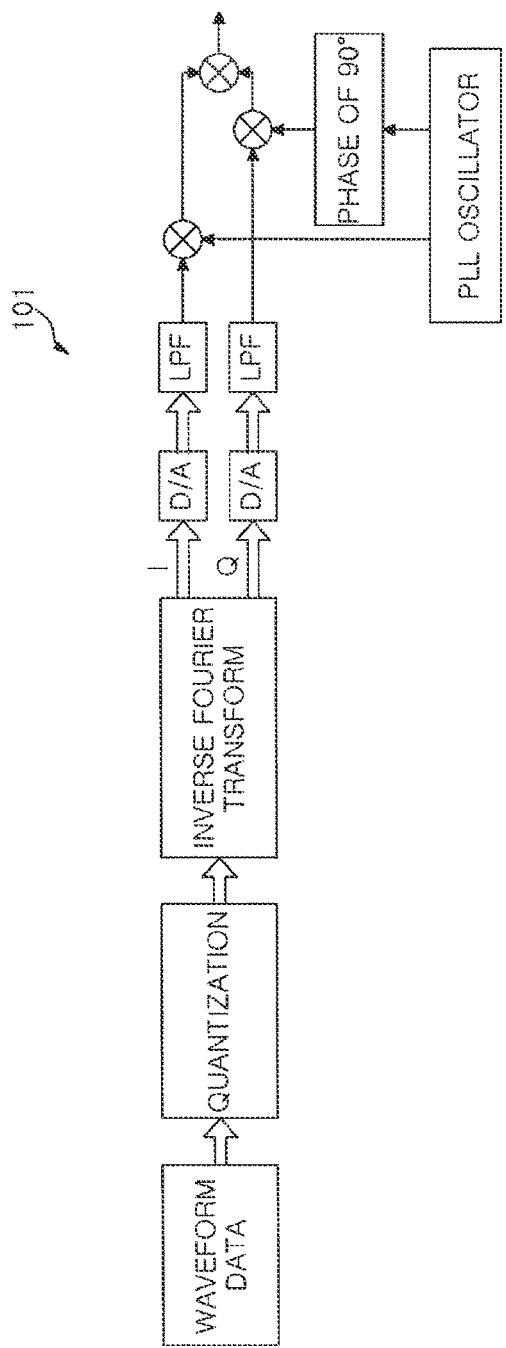
FIG. 4 is a diagram for describing a principle of generating a microwave signal in the example of the waveform generator.

FIG. 4 is a diagram for describing a principle of generating a microwave signal in the example of the waveform generator. As shown in FIG. 4, the waveform generator 101 may include a phase locked loop (PLL) oscillator and an IQ digital modulator. The PLL oscillator is configured to oscillate a microwave signal of which a phase is synchronized with a reference frequency. The IQ digital modulator is connected to the PLL oscillator. The waveform generator 101 sets a frequency of the microwave signal oscillated by the PLL oscillator to a set frequency specified by the control unit 100. The waveform generator 101 uses the IQ digital modulator to modulate the microwave signal from the PLL oscillator and a microwave signal having a phase difference of 90° from the microwave signal from the PLL oscillator. As a result, the waveform generator 101 generates a microwave signal having a plurality of frequency components or a microwave signal having a single frequency in a band.

The waveform generator 101 may generate a microwave signal having a plurality of frequency components by, for example, performing inverse discrete Fourier transform on N complex data symbols to generate a continuous signal. Such method for generating a signal may be the same as an orthogonal frequency-division multiple access (OFDMA) modulation method used in digital television broadcasting or the like (for example, see Japanese Patent No. 5320260).

As an example, the waveform generator 101 has waveform data represented by a sequence of pre-digitized codes. The waveform generator 101 quantizes the waveform data and applies inverse Fourier transform to the quantized data to generate data I and data Q. The waveform generator 101 performs digital/analog (D/A) conversion on each of the data I and the data Q to obtain two analog signals. The waveform generator 101 inputs the analog signals to a low pass filter (LPF) that passes only a low frequency component. The waveform generator 101 mixes the two analog signals outputted from the LPF with the microwave signal from the PLL oscillator and the microwave having a phase difference of 90° from the microwave signal from the PLL oscillator, respectively. The waveform generator 101 synthesizes a microwave signal generated by the mixing. As a result, the waveform generator 101 generates a microwave signal having one or more frequency components.

Referring back to FIG. 3, the microwave signal generated by the waveform generator 101 is inputted to the microwave output device 16. The microwave output device 16 includes a source power supply 16a, a waveguide 16b, a circulator 16c, a waveguide 16d, a waveguide 16e, a first directional coupler (DC) 16f, a second directional coupler (DC) 16h, a measuring unit 16k, and a dummy load (DL) 16j.

The source power supply 16a generates a microwave as a power wave from the microwave signal input from the waveform generator 101. The source power supply 16a includes a power controller 162, an attenuator 163, an amplifier 164, an amplifier 165, and a mode converter (MC) 166.

The waveform generator 101 is connected to the attenuator 163. As an example, the attenuator 163 is a device in which an attenuation amount (attenuation factor) is variable according to an applied voltage value. The power controller 162 is connected to the attenuator 163. The power controller 162 controls an attenuation factor (attenuation amount) of a microwave signal in the attenuator 163 using an applied voltage value. The power controller 162 controls the attenuation factor (attenuation amount) of the microwave signal in the attenuator 163 in order to generate a microwave having power corresponding to set power instructed by the control unit 100.

The power controller 162 may include a controller (CNT) 162a. The controller 162a may be a processor. The controller 162a acquires a configuration profile from the control unit 100. The controller 162a determines an attenuation factor (attenuation amount) of a microwave based on the acquired configuration profile.

An output of the attenuator 163 is connected to the mode converter 166 through the amplifier 164 and the amplifier 165. The amplifier 164 and the amplifier 165 each amplify a microwave signal output from the attenuator 163 at a predetermined amplification factor to generate a microwave. The mode converter 166 converts a propagation mode of the microwave output from the amplifier 165 from TEM to TE01 through mode conversion. A microwave generated through the mode conversion in the mode converter 166 is outputted from the source power supply 16a.

An output of the source power supply 16a is connected to one end of the waveguide 16b. The other end of the waveguide 16b is connected to a first port 261 of the circulator 16c. The circulator 16c includes the first port 261, a second port 262, and a third port 263. The circulator 16c is configured to output a microwave inputted to the first port 261 at the second port 262 and output the microwave inputted to the second port 262 at the third port 263. The second port 262 of the circulator 16c is connected to one end of the waveguide 16d. The other end of the waveguide 16d is an output 16t of the microwave output device 16.

The third port 263 of the circulator 16c is connected to one end of the waveguide 16e. The other end of the waveguide 16e is connected to the dummy load 16j. The dummy load 16j receives a microwave propagating in the waveguide 16e and absorbs the corresponding microwave. The dummy load 16j converts the microwave, for example, into heat.

The first directional coupler 16f is provided between one end and the other end of the waveguide 16b. The first directional coupler 16f is configured to diverge a portion of a microwave (that is, a traveling wave), which is outputted from the source power supply 16a and propagated to the output 16t, and to output the diverged portion of the traveling wave. The portion of the traveling wave outputted from the first directional coupler 16f is inputted to the measuring unit 16k.

The second directional coupler 16h is provided between one end and the other end of the waveguide 16e. The second directional coupler 16h is configured to diverge a portion of a microwave (that is, a reflected wave) transmitted to the third port 263 of the circulator 16c through the output 16t and to output the diverged portion of the reflected wave. The portion of the reflected wave outputted from the second directional coupler 16h is inputted to the measuring unit 16k.

The measuring unit 16k is configured to measure the power of a microwave. The measuring unit 16k includes a measurement controller (MEC) 167, a first detector (DT) 168, and a second detector (DT) 169. The first detector 168 is configured to detect the power of the portion of the traveling wave outputted from the first directional coupler 16f. The second detector 169 is configured to detect the power of the portion of the reflected wave outputted from the second directional coupler 16h.

The measurement controller 167 is configured to determine the power of a traveling wave at the output 16t in view of the power detected by the first detector 168. In addition, the measurement controller 167 is configured to determine power of a reflected wave at the output 16t from the power detected by the second detector 169.

The measuring unit 16k is connected to the power controller 162. The measuring unit 16k notifies the power controller 162 of the determined power of the traveling wave and the determined power of the reflected wave. The power controller 162 controls the attenuator 163 to match a difference between the power of the traveling wave and the power of the reflected wave, that is, the load power, with set power specified by the control unit 100.

The matching unit 51 includes a tuner controller (TC) 250 and a tuner detector (TD) 254. The tuner controller 250 adjusts the protruding positions of the stubs 51a, 51b, and 51c based on a signal of the control unit 100 and a detection result of the tuner detector 254 such that load impedance of the source power supply 16a matches the output impedance of the source power supply 16a. The load impedance of the source power supply 16a is the impedance of the antenna 28 side. The tuner detector 254 is, for example, a three-probe detector and includes three diode-attached probes. The tuner controller 250 operates the stubs 51a, 51b, and 51c through a driver circuit and an actuator of the matching unit 51.

Referring back to FIG. 2, the plasma processing apparatus 1 further includes a bias power supply 62. The bias power supply 62 is electrically connected to the lower electrode 18 through a matching unit (MU) 64. The bias power supply 62 is configured to generate radio frequency bias power. The radio frequency bias power has a frequency suitable for controlling the energy of ions colliding with the substrate W. A frequency of the radio frequency bias power is, for example, 13.56 MHz.

Figure 5:
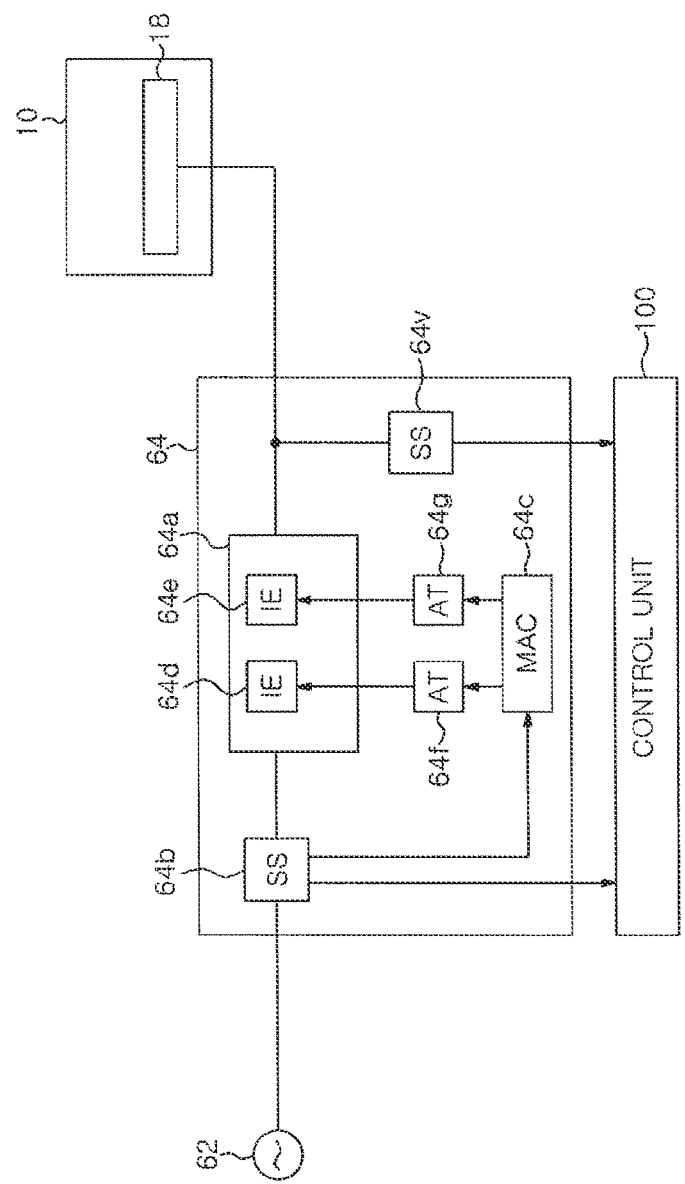
FIG. 5 is a diagram illustrating a matching unit in the plasma processing apparatus according to one exemplary embodiment.

FIG. 5 is a diagram illustrating the matching unit in the plasma processing apparatus according to one exemplary embodiment. The matching unit 64 includes a matching circuit 64a. The matching circuit 64a is configured to match the impedance of a load of a bias power supply 62 (hereinafter, referred to as "load impedance") with the output impedance of the bias power supply 62. The load of the bias power supply 62 includes the lower electrode 18 and plasma.

The matching unit 64 may further comprise a matching controller (MAC) 64c and a sensor (SS) 64b. The sensor 64b is configured to measure the load impedance of the bias power supply 62. The load impedance of the bias power supply 62 may be load impedance having the same frequency as a frequency of radio frequency bias power generated by the bias power supply 62. In one exemplary embodiment, the sensor 64b is configured to determine the load impedance of the bias power supply 62 from a current measurement value and a voltage measurement value in a radio frequency bias power supply circuit between the bias power supply 62 and the lower electrode 18. The sensor 64b notifies the control unit 100 and the matching controller 64c of the measured load impedance of the bias power supply 62. The matching controller 64c controls a variable impedance element of the matching circuit 64a to match the load impedance measured by the sensor 64b with the output impedance of the bias power supply 62.

In one exemplary embodiment, the matching circuit 64a includes variable impedance elements (IE) 64d and 64e. Each of the variable impedance elements 64d and 64e may be a variable capacitance capacitor. The matching controller 64c adjusts the impedance of each of the variable impedance elements 64d and 64e through actuators (AT) 64f and 64g. As a result, the load impedance of the bias power supply 62 is adjusted. Meanwhile, each of the actuators 64f and 64g may be a motor.

In one exemplary embodiment, the matching unit 64 further includes a sensor (SS) 64v. The sensor 64v is configured to measure a voltage at the lower electrode 18. The sensor 64v is configured to measure, for example, a voltage in the radio frequency bias power supply circuit between the matching circuit 64a and the lower electrode 18. The sensor 64b and the sensor 64v may not be included in the matching unit 64. That is, the sensor 64b and the sensor 64v may be components different from the matching unit 64.

In the plasma processing apparatus 1, the control unit 100 is configured to acquire an amount related to contamination of the substrate. The amount related to the contamination of the substrate is acquired from at least one of the impedance of a load including the lower electrode 18 (load impedance) and a peak-to-peak voltage $V_{PP}$ at the lower electrode 18. The load impedance is load impedance measured by the sensor 64b. The peak-to-peak voltage $V_{PP}$ at the lower electrode 18 is acquired from a voltage measured by the sensor 64v. Hereinafter, the method MT will be described, and in addition, acquiring of the amount related to the contamination of the substrate by the control unit 100 will be described.

The method MT starts in step ST1. Step ST1 is performed in a state in which the substrate W is mounted on the substrate support 14 and held by the electrostatic chuck 20. During step ST1, gas from the gas supply unit GS is supplied into the chamber 10, and a pressure of gas in the chamber 10 is set to a specified pressure via the exhaust device 19. In step ST1, the supply of a power wave from the source power supply 16a is initiated. In the plasma processing apparatus 1, the power wave is a microwave. In step ST1, after the power wave is supplied, the matching unit 51 operates to match the load impedance of the source power supply 16a with the output impedance of the source power supply 16a. During step ST1, radio frequency bias power from the bias power supply 62 is supplied to the lower electrode 18. In order to perform step ST1, the gas supply unit GS, the exhaust device 19, the microwave output device 16 including the source power supply 16a, and the bias power supply 62 are controlled by the control unit 100.

Subsequent step ST2 is performed during the supply of the power wave initiated in step ST1. In step ST2, a reflected wave of the power wave from the source power supply 16a is monitored. Specifically, in step ST2, the power of the reflected wave is measured by the measuring unit 16k. The power of the reflected wave is notified to the control unit 100. In step ST2, the control unit 100 determines whether the power of the reflected wave has been decreased to an allowable range (hereinafter, referred to as "first allowable range"). The power of the reflected wave included in the first allowable range is predetermined. As an example, the power of the reflected wave included in the first allowable range is less than or equal to 1% or less than or equal to 0.5, of a peak value of the power of the reflected wave.

In subsequent step ST3, a fluctuation amount of a measured value within a period after the supply of the power wave in step ST1 (hereinafter, referred to as "monitoring period") is acquired. The monitoring period may be a period after or immediately after it is determined in step ST2 that the power of the reflected wave has decreased to the first allowable range. A time length of the monitoring period is predetermined. As an example, the monitoring period starts when the power of the reflected wave reaches the power within the first allowable range, and a time length thereof is greater than or equal to one second and less than or equal to two seconds.

In step ST3, the fluctuation amount of the measured value may be acquired by the control unit 100. The fluctuation amount of the measured value is a fluctuation amount indicating a fluctuation in peak-to-peak voltage $V_{PP}$ at the lower electrode 18 or a fluctuation amount indicating a fluctuation in impedance of a load including the lower electrode 18. That is, in step ST3, the peak-to-peak voltage $V_{PP}$ at the lower electrode 18 or the impedance of the load including the lower electrode 18 is used as the measured value. The peak-to-peak voltage $V_{PP}$ at the lower electrode 18 is acquired by the sensor 64v. The control unit 100 may acquire a peak-to-peak voltage $V_{PP}$ from a voltage acquired by the sensor 64v during the monitoring period. The peak-to-peak voltage $V_{PP}$ acquired in step ST3 may be a peak-to-peak voltage of a voltage having the same frequency as a frequency of the radio frequency bias power. The impedance of the load including the lower electrode 18 is acquired by the sensor 64b and notified to the control unit 100. The fluctuation amount of the measured value acquired in step ST3 may be, for example, a difference between the maximum value and the minimum value of the measured value in the monitoring period. In step ST3, both fluctuation amounts of two measured values, that is, the fluctuation amount indicating the fluctuation in the peak-to-peak voltage $V_{PP}$ of the voltage at the lower electrode 18 and the fluctuation amount indicating the fluctuation in the impedance of the load including the lower electrode 18 may be acquired.

In one exemplary embodiment, the method MT may further include step ST4. In step ST4, it is determined whether the fluctuation amount of the measured value or each of the fluctuation amounts of the two measured values acquired in the step ST3 satisfies another allowable condition. The determination in step ST4 may be performed by the control unit 100. In step ST4, an allowable condition is satisfied when a ratio of a fluctuation amount of a measured value in a monitoring period to an average value of the measured value in the monitoring period is included within another allowable range (hereinafter, referred to as "second allowable range"). The ratio included in the second allowable range is predetermined. The ratio included in the second allowable range is, for example, less than or equal to 3% or less than or equal to 1%. When it is determined in step ST4 that the allowable condition is not satisfied, the control unit 100 may issue a warning indicating that plasma processing in the plasma processing apparatus 1 is likely to cause contamination of the substrate W.

When a sheath (that is, a plasma sheath) fluctuates on the substrate W mounted on the substrate support 14, contaminants floating outside the sheath may be attached to the substrate W. In the method MT, a fluctuation amount of a measured value indicates a fluctuation in the sheath formed on the substrate W (for example, a fluctuation in thickness of the sheath). Therefore, according to the method MT, it is possible to acquire an amount related to the contamination of the substrate W.

Figure 6:
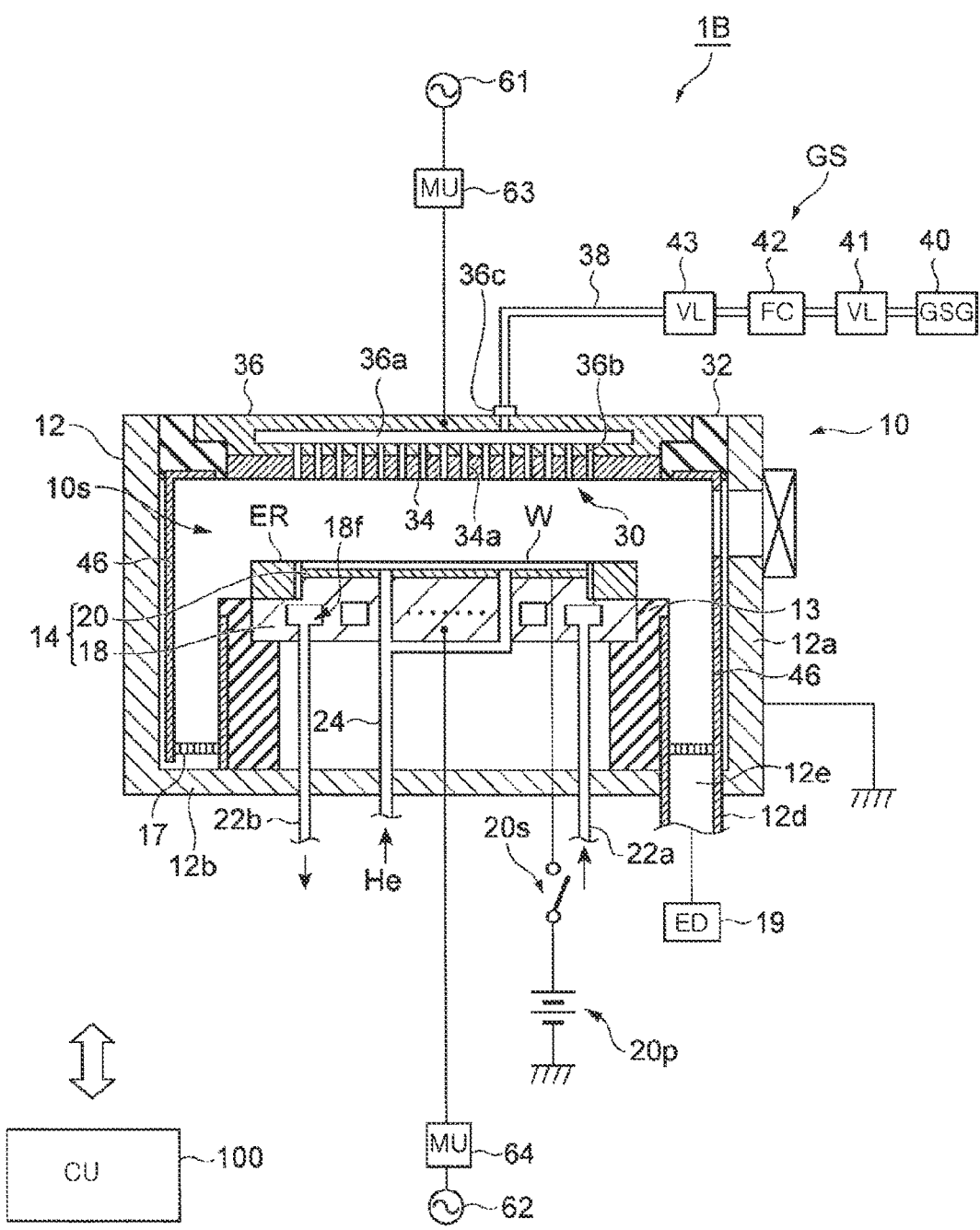
FIG. 6 is a schematic diagram illustrating a plasma processing apparatus according to another exemplary embodiment.

Hereinafter, another plasma processing apparatus to which a method MT is applicable will be described. FIG. 6 is a schematic diagram illustrating a plasma processing apparatus according to another exemplary embodiment. A plasma processing apparatus 1B shown in FIG. 6 is a capacitance-coupled type plasma processing apparatus. Hereinafter, differences between the plasma processing apparatus 1B and the plasma processing apparatus 1 will be described. In addition, differences between the method MT applied to the plasma processing apparatus 1B and the method MT applied to the plasma processing apparatus 1 will be described.

The plasma processing apparatus 1B includes an upper electrode 30. The upper electrode 30 is provided above a substrate support 14. The upper electrode 30 is supported on an upper portion of a chamber main body 12 through a member 32. The member 32 is formed of a material having an insulating property. The upper electrode 30 and the member 32 close an upper end opening of a sidewall 12a of the chamber main body 12.

The upper electrode 30 may include a top plate 34 and a support 36. A lower surface of the top plate 34 is a lower surface of an interior space 10s and defines the interior space 10s. The top plate 34 may be formed of a low resistance conductor or semiconductor having low Joule heat. A plurality of gas discharge holes 34a are formed in the top plate 34. The plurality of gas discharge holes 34a pass through the top plate 34 in a plate thickness direction thereof.

The support 36 includes an attachable/detachable material that supports the top plate 34. The support 36 is formed of a conductive material such as aluminum. A gas diffusion chamber 36a is provided inside the support 36. A plurality of gas holes 36b are formed in the support 36. The plurality of gas holes 36b extend downward from the gas diffusion chamber 36a. The plurality of gas holes 36b communicate with the plurality of gas discharge holes 34a. A gas introduction inlet 36c is formed in the support 36. The gas introduction inlet 36c is connected to the gas diffusion chamber 36a. A gas supply pipe 38 is connected to the gas introduction inlet 36c. In the plasma processing apparatus 1B, the gas supply pipe 38 is connected to a gas source group 40 through a valve group 41, a flow controller group 42, and a valve group 43. In the plasma processing apparatus 1B, gas from one or more gas sources selected from a plurality of gas sources in the gas source group 40 is supplied into the chamber 10 through the plurality of gas discharge holes 34a of the upper electrode 30.

The plasma processing apparatus 1B may further include a shield 46. The shield 46 is provided with an attachable/detachable material formed along an inner wall surface of the chamber main body 12. The shield 46 is also provided on an outer circumferential surface of a support portion 13. The shield 46 prevents etching byproducts from being attached to the chamber main body 12. The shield 46 is formed, for example, by forming a corrosion-resistant film on a surface of a member formed of aluminum. The corrosion-resistant film may be a film formed of a ceramic such as yttrium oxide. In the plasma processing apparatus 1B, the baffle plate 17 is provided between the support portion 13 and a sidewall of the chamber main body 12.

The plasma processing apparatus 1B includes a source power supply 61 instead of the microwave output device 16 including a source power supply 16a. The source power supply 61 is a power supply that generates a radio frequency wave as a power wave to generate plasma. The radio frequency wave generated by the source power supply 61 has a frequency suitable for plasma generation. A frequency of the radio frequency wave frequency generated by the source power supply 61 is, for example, a frequency in a range of 27 MHz to 100 MHz.

Figure 7:
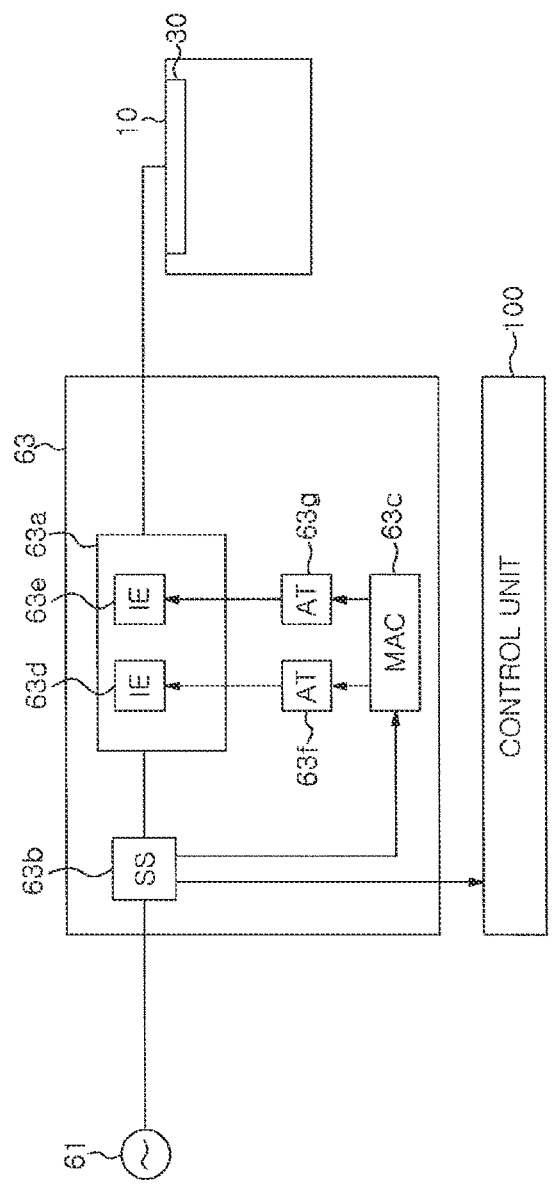
FIG. 7 is a diagram illustrating a matching unit in the plasma processing apparatus according to another exemplary embodiment.

The source power supply 61 is connected to the upper electrode 30 through a matching unit (MU) 63. FIG. 7 is a diagram illustrating a matching unit in the plasma processing apparatus according to another exemplary embodiment. As shown in FIG. 7, the matching unit 63 includes a matching circuit 63a. The matching circuit 63a is configured to match the impedance of a load of the source power supply 61 (hereinafter, referred to as "load impedance") with the output impedance of the source power supply 61. The load of the source power supply 61 includes the upper electrode 30 and plasma. In another exemplary embodiment, the source power supply 61 may be connected to a lower electrode 18 through the matching unit 63.

The matching unit 63 may further include a matching controller (MAC) 63c and a sensor (SS) 63b. The sensor 63b is configured to measure the load impedance of the source power supply 61. The load impedance of the source power supply 61 may be load impedance having the same frequency as a frequency of a power wave (that is, a radio frequency wave) generated by the source power supply 61. In one exemplary embodiment, the sensor 63b is configured to determine the load impedance of the source power supply 61 from current and voltage measurement values in a radio frequency power supply circuit between the source power supply 61 and the upper electrode 30. The sensor 63b notifies a control unit 100 and the matching controller 63c of the measured load impedance of the source power supply 61. The matching controller 63c controls a variable impedance element of the matching circuit 63a to match the load impedance measured by the sensor 63b with the output impedance of the source power supply 61.

In one exemplary embodiment, the matching circuit 63a includes variable impedance elements (IE) 63d and 63e. Each of the variable impedance elements 63d and 63e may be a variable capacitance capacitor. The matching controller 63c adjusts the impedance of each of the variable impedance elements 63d and 63e through actuators (AT) 63f and 63g. As a result, the load impedance of the source power supply 61 is adjusted. Meanwhile, each of the actuators 63f and 63g may be a motor.

When plasma is generated in the plasma processing apparatus 1B, gas is supplied from a gas supply unit GS to the interior space 10s. In addition, a power wave (that is, a radio frequency wave) is supplied from the source power supply 61, and thus, a radio frequency electric field is generated between the upper electrode 30 and the lower electrode 18. The gas is excited by the radio frequency electric field. As a result, plasma is generated. Furthermore, radio frequency bias power is supplied to the lower electrode 18 from a bias power supply 62, and thus, energy of ions supplied from the plasma to the substrate W is adjusted.

When the method MT is applied to the plasma processing apparatus 1B, a reflected wave of a power wave (that is, a radio frequency wave) from the source power supply 61 is monitored in step ST2. Specifically, in step ST2, the power of the reflected wave is measured by the sensor 63b. The power of the reflected wave is notified to the control unit 100. Similar to a case where the plasma processing apparatus 1 is used, in step ST2, the control unit 100 determines whether the power of the reflected wave has been decreased to a first allowable range. The power of the reflected wave included in the first allowable range is predetermined.

While certain embodiments have been described above, these embodiments are not limiting, and various additions, omissions, substitutions and changes may be made. Further, it is possible to combine the elements of different embodiments to form another embodiment.

For example, the plasma processing apparatus to which the method MT is applied may be an inductance-coupled type plasma processing apparatus or an electron cyclotron resonance (ECR) plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, and the scope of the inventive concept is defined by the attached claims.

The invention claimed is:

1. An inspection method comprising:
monitoring power of a reflected wave of a power wave supplied from a source power supply for generation of plasma in a plasma processing apparatus, wherein the power wave is a radio frequency wave or a microwave, the plasma processing apparatus comprises a chamber and a substrate support configured to support a substrate in the chamber, and the substrate support comprises a lower electrode;
obtaining a fluctuation amount of a measured value within a period after initiation of the supply of the power wave, wherein the fluctuation amount of the measured value is a fluctuation amount indicating a fluctuation in a peak-to-peak voltage at the lower electrode or a fluctuation amount indicating a fluctuation in impedance of a load including the lower electrode; and
determining whether the fluctuation amount of the measured value satisfies an allowable condition,
wherein the allowable condition is satisfied when a ratio of the fluctuation amount of the measured value to an average value of the measured value within the period is included within another allowable range.

2. The inspection method of claim 1, wherein the period is a period after the power of the reflected wave has decreased to an allowable range.

3. The inspection method of claim 1, wherein the fluctuation amount of the measured value is a difference between a maximum value of the measured value and a minimum value of the measured value within the period.

4. A plasma processing apparatus comprising:
a chamber;
a substrate support comprising a lower electrode and configured to support a substrate in the chamber;
a source power supply configured to supply a power wave for generation of plasma from gas in the chamber, wherein the power wave is a radio frequency wave or a microwave;

a matching unit connected between the chamber and the source power supply;

a measuring unit configured to measure power of a reflected wave of the power wave; and a control unit, wherein the control unit is configured to obtain a fluctuation amount of a measured value within a period after initiation of the supply of the power wave, and the fluctuation amount of the measured value is a fluctuation amount indicating a fluctuation in peak-to-peak voltage at the lower electrode or a fluctuation amount indicating a fluctuation in impedance of a load including the lower electrode, wherein the control unit is configured to determine whether the fluctuation amount of the measured value satisfies an allowable condition, and wherein the control unit is configured to determine that the allowable condition is satisfied when a ratio of the fluctuation amount of the measured value to an average value of the measured values within the period is included within another allowable range.

5. The plasma processing apparatus of claim 4, wherein the control unit is configured to obtain the fluctuation amount of the measured value within the period after the power of the reflected wave has decreased to an allowable range.

6. The plasma processing apparatus of claim 4, wherein the control unit is configured to obtain a difference between a maximum value of the measured value and a minimum value of the measured value within the period as the fluctuation amount of the measured value.

7. The plasma processing apparatus of claim 4, further comprising:

a bias power supply electrically connected to the lower electrode;

a matching unit connected between the lower electrode and the bias power supply; and a sensor configured to measure the impedance, wherein the impedance is impedance of a load of the bias power supply.

8. The plasma processing apparatus of claim 4, further comprising a sensor configured to measure a voltage at the lower electrode, wherein the control unit is configured to acquire the peak-to-peak voltage from the voltage measured by the sensor.

9. The plasma processing apparatus of claim 4, further comprising an upper electrode provided above the lower electrode, wherein the source power supply is electrically connected to the upper electrode.

* * * * *

UNITED STATES PATENT AND TRADEMARK OFFICE
CERTIFICATE OF CORRECTION

PATENT NO. : 11,705,313 B2
APPLICATION NO. : 17/193205
DATED : July 18, 2023
INVENTOR(S) : Yusuke Hirayama et al.

It is certified that error appears in the above-identified patent and that said Letters Patent is hereby corrected as shown below:

On the Title Page

Item [56], delete "JP 5320260 82 10/2013" and insert -- JP 5320260 B2 10/2013 --.

Signed and Sealed this
Twenty-ninth Day of August, 2023

Katherine Kelly Vidal
*Director of the United States Patent and Trademark Office*